United States Patent
Zhao et al.

(10) Patent No.: US 11,997,878 B2
(45) Date of Patent: May 28, 2024

(54) ARRAY SUBSTRATE AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Huihui Zhao, Hubei (CN); Changbum Park, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 649 days.

(21) Appl. No.: 17/266,597

(22) PCT Filed: Sep. 8, 2020

(86) PCT No.: PCT/CN2020/113893
§ 371 (c)(1),
(2) Date: Feb. 7, 2021

(87) PCT Pub. No.: WO2022/016679
PCT Pub. Date: Jan. 27, 2022

(65) Prior Publication Data
US 2022/0310730 A1 Sep. 29, 2022

(30) Foreign Application Priority Data
Jul. 21, 2020 (CN) .......................... 202010706047.5

(51) Int. Cl.
*H01L 27/12* (2006.01)
*H10K 59/121* (2023.01)

(52) U.S. Cl.
CPC ..... *H10K 59/1213* (2023.02); *H01L 27/1225* (2013.01); *H01L 27/1259* (2013.01)

(58) Field of Classification Search
CPC .. H10K 59/1213; H10K 59/123; H10K 59/12; H01L 21/77; H01L 21/70;
(Continued)

(56) References Cited

U.S. PATENT DOCUMENTS

2013/0146900 A1 6/2013 Yeo et al.
2020/0006406 A1 1/2020 Song et al.

FOREIGN PATENT DOCUMENTS

| CN | 107316874 A | 11/2017 |
| CN | 108376672 A | 8/2018 |

(Continued)

OTHER PUBLICATIONS

Machine translation of CN109671719 (Year: 2019).*
(Continued)

*Primary Examiner* — Nikolay K Yushin
(74) *Attorney, Agent, or Firm* — PV IP PC; Wei Te Chung; Zhigang Ma

(57) ABSTRACT

An array substrate and a manufacturing method thereof are provided. The array substrate includes a substrate and a first recess. The first recess sequentially extends through a second dielectric layer, a third insulating layer, a first dielectric layer, a second insulating layer, a first insulating layer, an active layer, and a portion of a barrier layer. A bottom surface of the first recess is formed inside the barrier layer.

9 Claims, 3 Drawing Sheets

(58) Field of Classification Search
CPC . H01L 21/78; H01L 27/1225; H01L 27/1259; H01L 27/1248; H01L 27/12; H01L 27/1214; H01L 2021/775; H01L 2021/77; H01L 2021/78
See application file for complete search history.

(56) References Cited

FOREIGN PATENT DOCUMENTS

| | | | |
|---|---|---|---|
| CN | 108493198 | A | 9/2018 |
| CN | 108598089 | A | 9/2018 |
| CN | 109671719 | A | 4/2019 |
| CN | 110137186 | A | 8/2019 |
| CN | 110190073 | A | 8/2019 |
| CN | 110416233 | A | 11/2019 |
| CN | 111063696 | A | 4/2020 |
| CN | 111106149 | A | 5/2020 |
| WO | 2014034566 | A1 | 3/2014 |

OTHER PUBLICATIONS

International Search Report in International application No. PCT/CN2020/113893, dated Apr. 20, 2021.
Written Opinion of the International Search Authority in International application No. PCT/CN2020/113893, dated Apr. 20, 2021.
Chinese Office Action issued in corresponding Chinese Patent Application No. 202010706047.5 dated Jun. 23, 2022, pp. 1-10.
Chinese Decision of Rejection issued in corresponding Chinese Patent Application No. 202010706047.5 dated Jul. 17, 2023, pp. 1-8.

* cited by examiner

ARRAY SUBSTRATE AND MANUFACTURING METHOD THEREOF

FIELD OF DISCLOSURE

The present disclosure relates to the field of display panels, in particular, relates to an array substrate and a manufacturing method thereof.

BACKGROUND

Low temperature polycrystalline oxide (LTPO) is an organic light-emitting diode (OLED) display technology with low power consumption. LTPO thin film transistors (TFTs) have a lower driving power than low temperature poly-silicon (LTPS) TFTs. LTPS needs 60 Hz to display still images, but LTPO can be reduced to only 1 Hz, which greatly reduces a driving power. The LTPO converts part of transistors into oxides, so that there is less leakage current, and a capacitor voltage (charge) can be maintained for one second to drive 1 Hz. A leakage current of the LTPS is larger, even driving a stationary pixel also requires 60 Hz. Otherwise, a brightness will be greatly reduced, while the LTPO will not. Therefore, LTPO products with lower power consumption are increasingly sought after by people.

In comparison with the LTPS, manufacturing the LTPO requires more layers. The LTPS transistor is manufactured, and then metal oxide (e.g., IGZO) is deposited on it by sputtering to form an oxide transistor. In order to prevent the LTPS transistor and the IGZO transistor from interfering with each other, there is a thicker inorganic film between the two as a barrier. Thus, there is a thicker inorganic film layer between a source/drain electrode (SD) and an active layer (poly). Due to a requirement of high pixels per inch (PPI), a diameter of the source/drain electrode connected to the active layer is usually small, generally between 2 μm to 4 μm, and a depth of a hole from the source/drain electrode to the active layer ranges from 1 μm to 1.5 μm. The narrow and deep hole is prone to following two defects during etching. The inorganic layer is easy to remain, and the remaining inorganic layer will increase a contact resistance when connecting the SD and the poly. In the deep and small hole, a wiring of the SD is easy to break, causing the SD and the poly to connect abnormally. The above problems can usually lead to a decrease in a yield of LTPO products.

SUMMARY OF DISCLOSURE

The present disclosure provides an array substrate and a manufacturing method thereof to solve the technical problems that a contact hole of a source/drain electrode and an active layer in the array substrate is too small, which causes the source/drain electrode to break.

The technical solutions to solve the above technical problems are as follows. The present disclosure provides an array substrate, including a substrate, a first recess, and a first source/drain electrode. A barrier layer, an active layer, a first insulating layer, a second insulating layer, a first dielectric layer, a third insulating layer, and a second dielectric layer are sequentially disposed on a surface of the substrate. The first recess sequentially extends through the second dielectric layer, the third insulating layer, the first dielectric layer, the second insulating layer, the first insulating layer, the active layer, and a portion of the barrier layer. A bottom surface of the first recess is formed inside the barrier layer. The first source/drain electrode is disposed on a surface of the second dielectric layer away from the third insulating layer and covers an inner sidewall and the bottom surface of the first recess. The first source/drain electrode is connected to the active layer.

Furthermore, the array substrate further includes a first gate, a second gate, and a passivation layer. The first gate is disposed on a surface of the first insulating layer away from the barrier layer. The second insulating layer covers the first gate. The second gate is disposed on a surface of the second insulating layer away from the first insulating layer. The first dielectric layer covers the second gate.

Furthermore, the passivation layer is disposed on the surface of the second dielectric layer away from the third insulating layer, covers the first source/drain electrode, and fills the first recess.

Furthermore, the array substrate further includes a second recess and a first planarization layer. The second recess sequentially extends through the passivation layer, the second dielectric layer, the third insulating layer, the first dielectric layer, the second insulating layer, the first insulating layer, the barrier layer, and a portion of the substrate. The first planarization layer is disposed on a surface of the passivation layer away from the second dielectric layer and fills the second recess.

Furthermore, the substrate includes a first flexible layer, a first buffer layer, a second flexible layer, and a second buffer layer. The first buffer layer is disposed on a surface of the first flexible layer. The second flexible layer is disposed on a surface of the first buffer layer away from the first flexible layer. The second buffer layer is disposed on a surface of the second flexible layer away from the first buffer layer.

A bottom surface of the second recess is flush with a surface of the second flexible layer away from the first flexible layer.

Furthermore, the first recess includes a first via hole and a first inverted trapezoid recess. The first via hole extends through the second dielectric layer and the third insulating layer. The first inverted trapezoid recess extends through the first dielectric layer, the second insulating layer, the first insulating layer, the active layer, and a portion of the barrier layer. The first inverted trapezoid recess is disposed correspondingly to the first via hole, and a width of an opening of the first inverted trapezoid recess is less than a diameter of the first via hole.

Furthermore, an included angle between the inner sidewall of the first via hole and a surface of the first dielectric layer ranges from 40 degrees to 80 degrees.

The present disclosure also provides a manufacturing method of an array substrate, including following steps: providing a substrate; sequentially forming a barrier layer, an active layer, a first insulating layer, a second insulating layer, a first dielectric layer, a third insulating layer, and a second dielectric layer on the substrate; etching the second dielectric layer, the third insulating layer, the first dielectric layer, the second insulating layer, the first insulating layer, the active layer, and a portion of the barrier layer to form a first recess, where a bottom surface of the first recess is formed inside the barrier layer; forming a first source/drain electrode on the second dielectric layer at a top edge of the first recess, and covering an inner sidewall and the bottom surface of the first recess with a middle section of the first source/drain electrode; and forming a passivation layer on the second dielectric layer, where the passivation layer covers the first source/drain electrode.

Furthermore, after forming the first insulating layer, the method further includes a step of forming a first gate on the first insulating layer. The first gate corresponds to the active layer. After forming the second insulating layer, the method further includes a step of forming a second gate on the second insulating layer. The second gate corresponds to the first gate.

Furthermore, the step of forming the first recess includes: etching the second dielectric layer and the third insulating layer to form a first via hole; and etching the first dielectric layer, the second insulating layer, the first insulating layer, the active layer, and a portion of the barrier layer at a position corresponding to a second via hole to form a first inverted trapezoid recess. A stepped surface is formed between a sidewall of the first via hole and a sidewall of the first inverted trapezoid recess, and the stepped surface is formed on the first dielectric layer.

Furthermore, when the first via hole is formed, the second dielectric layer and the third insulating layer are etched to form the second via hole stimulatingly. When the first inverted trapezoid recess is formed, the first dielectric layer, the second insulating layer, the first insulating layer, the barrier layer, and a portion of the substrate at a position corresponding to the second via hole are etched to form a second inverted trapezoid recess stimulatingly, and the second via hole and the second inverted trapezoid recess are connected to form a second recess. The first via hole and the second via hole are formed by a same mask, and the first inverted trapezoid recess and the second inverted trapezoid recess are formed by a same mask.

Advantages of the present disclosure are as follow. In the array substrate and the manufacturing method there of, the sidewall of the first recess extends through the active layer and the source/drain electrode. By connecting the first recess with the active layer, a contact area of the active layer and the source/drain electrode is increased, and a contact resistance is reduced. The stepped surface is formed on the sidewall of the first recess, and the source/drain electrode covers the stepped surface, which has a buffering effect and prevents the source/drain electrode from breaking caused by an excessively long side wall of the first recess.

BRIEF DESCRIPTION OF DRAWINGS

With reference to the accompanying drawings, through a detailed description of the specific embodiments of the present disclosure, the technical solutions and other beneficial effects of the present disclosure will be apparent.

Figure 1:
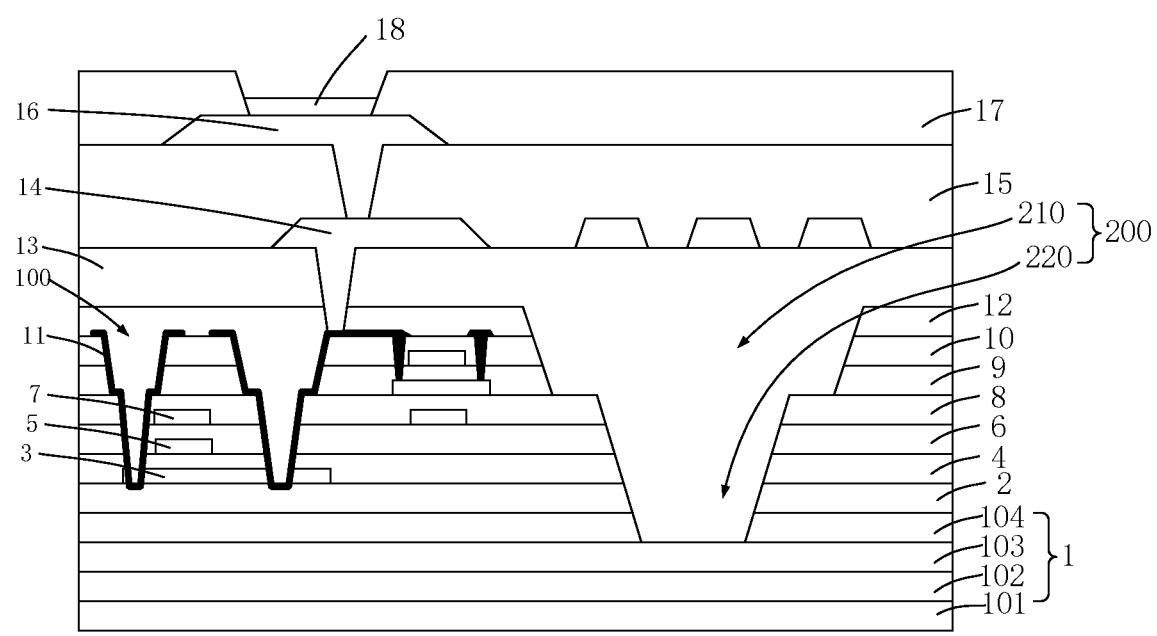
FIG. 1 is a schematic diagram of an array substrate of an embodiment.

Reference numerals in the drawings are as follows.
substrate 1; barrier layer 2;
active layer 3; first insulating layer 4;
first gate 5; second insulating layer 6;
second gate 7; first dielectric layer 8;
third insulating layer 9; second dielectric layer 10;
first source/drain electrode 11; passivation layer 12;
first planarization layer 13; second source/drain electrode 14;
second planarization layer 15; anode layer 16;
pixel definition layer 17; luminescent layer 18;
stepped surface 121; first recess 100;
first via hole 110; first inverted trapezoid recess 120;
second recess 200; second via hole 210;
second inverted trapezoid recess 220.

DETAILED DESCRIPTION

The technical solutions in the embodiments of the present disclosure will be clearly and completely described below in conjunction with the drawings of the embodiments of the present disclosure. Apparently, the described embodiments are only a part of the embodiments of the present disclosure, rather than all the embodiments. Based on the embodiments in the present disclosure, all other embodiments obtained by those skilled in the art without creative efforts are within the protection scope of the present disclosure.

Embodiments

As shown in FIG. 1, in this embodiment, an array substrate of the present disclosure includes a substrate 1, a barrier layer 2, an active layer 3, a first insulating layer 4, a first gate 5, a second insulating layer 6, a second gate 7, a first dielectric layer 8, a third insulating layer 9, a second dielectric layer 10, a first source/drain electrode 11, a passivation layer 12, a first planarization layer 13, a second source/drain electrode 14, a second planarization layer 15, an anode layer 16, a pixel definition layer 17, and a luminescent layer 18.

The substrate 1 is a flexible substrate, and includes a first flexible layer 101, a first buffer layer 102, a second flexible layer 103, and a second buffer layer 104. The first flexible layer 101 and the second flexible layer 103 are disposed layer-by-later and have good flexibility, which is convenient for bending and folding the array substrate. The first buffer layer 102 and the second buffer layer 104 arranged between the flexible layers can well protect the first flexible layer 101 and the second flexible layer 103 and avoid cracks due to excessive stress during a bending process.

The barrier layer 2 is disposed on a surface of the substrate 1. The barrier layer 2 is configured to prevent external moisture from entering the array substrate through the substrate 1, so as to prevent the moisture from corroding a circuit structure inside the array substrate and increase lifespan of the array substrate.

The active layer 3 is disposed on an upper surface of the barrier layer 2. The active layer 3 is made of a semiconductor material. The semiconductor material includes indium gallium zinc oxide (IGZO), indium gallium titanium oxide (IZTO), and indium gallium zinc titanium oxide (IGZTO). A thickness of the active layer 3 ranges from 100 angstroms to 1000 angstroms. The active layer 23 provides circuit support for the display panel.

The first insulating layer 4 is disposed on a surface of the barrier layer 2 away from the substrate 1. The first insulating layer 4 is made of an inorganic material. The inorganic material includes silicon oxide, silicon nitride, or a multi-layer film structure. A thickness of the first insulating layer 4 ranges from 1000 angstroms to 3000 angstroms. The first insulating layer 4 corresponds to the active layer 3 and covers the active layer 3. The first insulating layer 4 functions as an insulation and is configured to prevent short circuits between lines inside the array substrate.

The first gate 5 is disposed on an upper surface of the first insulating layer 4. The first gate 5 is made of a metal material. The metal material includes molybdenum (Mo), aluminum (Al), copper (Cu), titanium (Ti), etc., an alloy, or a multilayer film structure. A thickness of the first gate 5 ranges from 2000 angstroms to 8000 angstroms. The first gate 5 and the first insulating layer 4 are arranged correspondingly.

The second insulating layer 6 is disposed on a surface of the first insulating layer 4 away from the buffer layer 2. The second insulating layer 6 is made of an inorganic material. The inorganic material includes silicon oxide, silicon nitride, or a multilayer film structure. A thickness of the second insulating layer 6 ranges from 1000 angstroms to 3000 angstroms. The second insulating layer 6 corresponds to the active layer 3 and covers the active layer 3. The second insulating layer 6 functions as an insulation and is configured to prevent short circuits between the lines inside the array substrate.

The second gate 7 is disposed on a surface of the second insulating layer 6 away from the first insulating layer 4. The second gate 7 is made of metal material. The metal material includes molybdenum (Mo), aluminum (Al), copper (Cu), titanium (Ti), etc., or an alloy, or a multilayer film structure. A thickness of the second gate 7 ranges from 2000 angstroms to 8000 angstroms. The second gate 7 corresponds to the second insulating layer 6.

The first dielectric layer 8 is disposed on upper surfaces of the second gate 7 and the second insulating layer 6. The first dielectric layer 8 is an interlayer insulating layer. The first dielectric layer 8 is made of an inorganic material. The inorganic material includes silicon oxide, silicon nitride, or a multilayer film structure. The first dielectric layer 8 functions as an insulation and is configured to prevent short circuits. A thickness of the first dielectric layer 8 ranges from 2000 angstroms to 10000 angstroms.

The third insulating layer 9 is disposed on a surface of the first dielectric layer 8 away from the second insulating layer 6. The third insulating layer 9 is made of an inorganic material. The inorganic material includes silicon oxide, silicon nitride, or a multilayer film structure. A thickness of the first insulating layer 4 ranges from 1000 angstroms to 3000 angstroms. The third insulating layer 9 corresponds to the active layer 3 and covers the active layer 3. The third insulating layer 9 functions as an insulation and is configured to prevent short circuits between the lines inside the array substrate.

The second dielectric layer 10 is disposed on a surface of the third insulating layer 9 away from the first dielectric layer 8. The second dielectric layer 10 is an interlayer insulating layer. The second dielectric layer 10 is made of an inorganic material. The inorganic material includes silicon oxide, silicon nitride, or a multilayer film structure. The second dielectric layer 10 functions as an insulation and is configured to prevent short circuits. A thickness of the second dielectric layer 10 ranges from 2000 angstroms to 10000 angstroms.

In order to facilitate an electrical connection between the first source/drain electrode 11 and the active layer 3, it is generally necessary to form via holes on the second dielectric layer 10, the third insulating layer 9, the first dielectric layer 8, the second insulating layer 6, and the first insulating layer 4. The active layer 3 is partially exposed by the via holes, so that the first source/drain electrode 11 is electrically connected to the active layer 3 through the via holes.

In this embodiment, a top surface of the first recess 100 is flush with a surface of the second dielectric layer 10 away from the third insulating layer 9, and its sidewall extends through the second dielectric layer 10, the third insulating layer 9, the first dielectric layer 8, the second insulating layer 6, the first insulating layer 4, the active layer 3, and a portion of the barrier layer 2. A bottom surface of the first recess 100 is formed inside of the barrier layer 2. The first recess 100 extends through the active layer 3, that is, the active layer 3 is partially exposed on a sidewall of the first recess 100.

Figure 2:
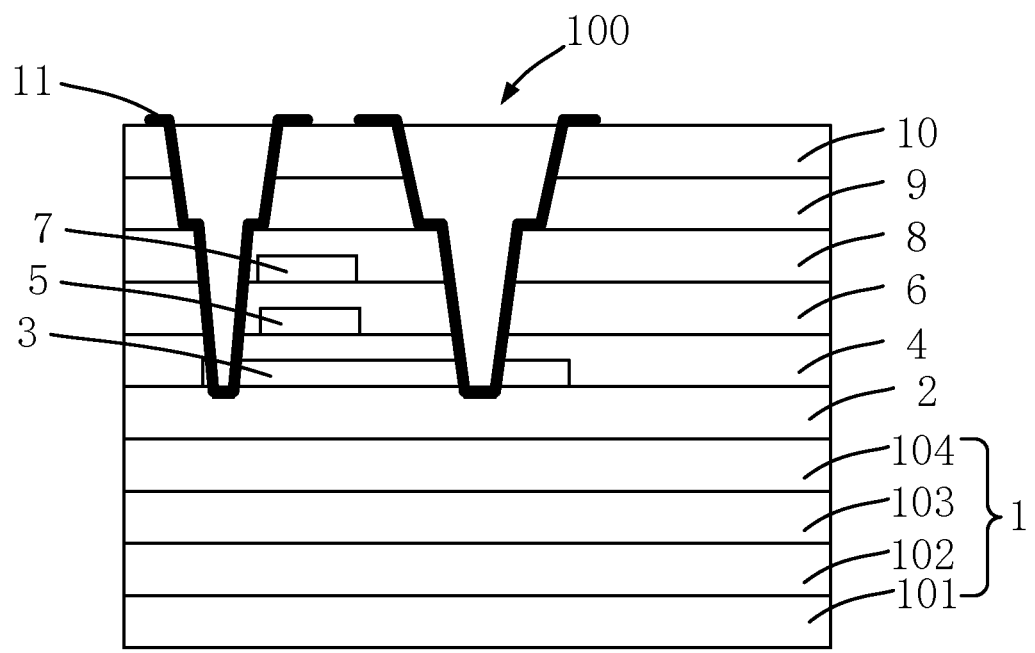
FIG. 2 is a schematic diagram of a first source/drain electrode of the embodiment.

As shown in FIG. 2, both ends of the first source/drain electrode 11 are formed on the second dielectric layer 10 at a top edge of the first recess. A middle section of the first source/drain electrode 11 cover the sidewall and the bottom surface of the first recess 100.

Since the active layer 3 is partially exposed on the sidewall of the first recess 100, the first source/drain electrode 11 covers the sidewall of the first recess 100, and the first source/drain electrode 11 is electrically connected to the active layer 3. Also, the bottom surface of the first recess 100 is formed inside the barrier layer 2, so the first source/drain electrode can be completely connected to a cross-sectional surface of the active layer 3, thereby improving transmission performance.

Figure 3:
FIG. 3 is a schematic diagram of a first via hole of the embodiment.
Figure 4:
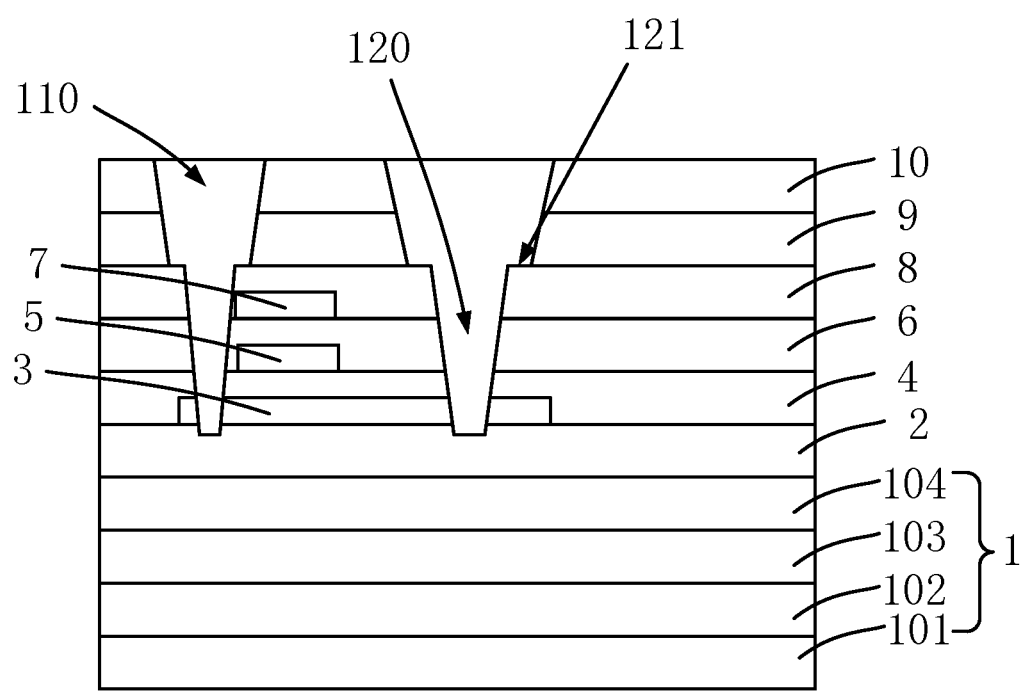
FIG. 4 is a schematic diagram of a first recess of the embodiment.

As shown in FIG. 3 and FIG. 4, in order to better protect the first source/drain electrode 11, specifically, the first recess 100 includes a first via hole 110 and a first inverted trapezoid recess 120. A top surface of the first via hole 110 is flush with the surface of the second dielectric layer 10 away from the third insulating layer 9. The first via hole 110 extends through the second dielectric layer 10 and the third insulating layer 9. A bottom surface of the first via hole 110 is flush with the surface of the first dielectric layer 8 away from the second insulating layer 6.

A top surface of the first inverted trapezoid recess 120 is flush with the surface of the first dielectric layer 8 away from the second insulating layer 6. Its sidewall extends through the first dielectric layer 8, the second insulating layer 6, the first insulating layer 4, the active layer 3, and a portion of the barrier layer 2. A bottom surface of the first inverted trapezoid recess 120 is formed inside the barrier layer 2.

An area of the bottom surface of the first via hole 110 is greater than an area of the top surface of the first inverted trapezoid recess 120. That is, a stepped surface 121 is formed between the bottom surface of the first via hole 110 and the top surface of the first inverted trapezoid recess 120. The stepped surface 121 is flush with the surface of the first dielectric layer 8 away from the second insulating layer 6.

When the first source/drain electrode 11 covers the inner wall of the first recess 100, the stepped surface 121 reduces a tilting force. The stepped surface 121 can act as a buffer to prevent the first source/drain electrode 11 from breaking due to excessively long side walls.

In this embodiment, an inner included angle between the sidewall of the first via hole 110 and the bottom surface ranges from 40 degrees to 80 degrees. An internal tension of the first source/drain electrode 11 can be well reduced, and the problem of the first source/drain electrode 11 breaking inside the first recess 100 can be avoided.

The passivation layer 12 is disposed on a surface of the second dielectric layer 10 away from the third insulating layer 9. Material of the passivation layer 12 includes SiOx, SiNx, AlO, and a stack of SiO and SiN. A thickness of the passivation layer 12 ranges from 100 nm to 1000 nm. The passivation layer 12 has functions of insulating and isolating external moisture and oxygen, and can prevent hydrogen atoms or moisture from entering the first source/drain electrode 11.

In this embodiment, the array substrate includes a display area 21 and a non-display area 22. The active layer 3, the first gate 5, the second gate 7, and the first source/drain electrode 11 correspond to the display area 21. The substrate 1, the barrier layer 2, the first insulating layer 4, the second insulating layer 6, the first dielectric layer 8, the third insulating layer 9, the second dielectric layer 10, and the passivation layer 12 extend from the display area 21 to the non-display area 22.

In the non-display area 22, a top surface of the second recess 200 is flush with a surface of the passivation layer 12 away from the second dielectric layer 10. Its sidewall extends through the passivation layer, the second dielectric layer 10, the third insulating layer 9, the first dielectric layer 8, the second insulating layer 6, the first insulating layer 4, the barrier layer 2, and the second buffer layer 104. A bottom surface of the second recess 200 is flush with a surface of the second flexible layer 103 away from the first buffer layer 102.

Specifically, the second recess 200 includes a second via hole 210 and a second inverted trapezoid recess 220. A top surface of the second via hole 210 is flush with the surface of the passivation layer 12 away from the second dielectric layer 10. The second via hole 110 extends through the passivation layer 12, the second dielectric layer 10, and the third insulating layer 9. A bottom surface of the second via hole 210 is flush with the surface of the first dielectric layer 8 away from the second insulating layer 6.

A top surface of the second inverted trapezoid recess 120 is flush with the surface of the first dielectric layer 8 away from the second insulating layer 6. Its sidewall extends through the first dielectric layer 8, the second insulating layer 6, the first insulating layer 4, the barrier layer 2, and the second buffer layer 104. A bottom surface of the second via hole 210 is flush with the surface of the second flexible layer 103 away from the first buffer layer 102.

An area of the bottom surface of the second via hole 210 is greater than an area of a top surface of the second inverted trapezoid recess 220. That is, a stepped surface is formed between the bottom surface of the first via hole 110 and the top surface of the first inverted trapezoid recess 120. The stepped surface is flush with the surface of the first dielectric layer 8 away from the second insulating layer 6. An inner included angle between the inner sidewall and the bottom surface of the second via hole 210 ranges from 20 degrees to 70 degrees.

The first planarization layer 13 is disposed on an upper surface of the passivation layer 12. The first planarization layer 13 extends from the display area 21 to the non-display area 22, and fills the second recess 200.

The second source/drain electrode 14 is disposed on an upper surface of the first planarization layer 13, extends through the first planarization layer 13, and is electrically connected to the first source/drain electrode 11.

The second planarization layer 15 is disposed on the upper surface of the first planarization layer 13, and the second planarization layer 15 covers the second source/drain electrode 14.

The anode layer 16 is disposed on the second planarization layer 15, extends through the second planarization layer 15, and is electrically connected to the second source/drain electrode 14.

The pixel definition layer 17 is disposed on an upper surface of the second planarization layer 15, and the pixel definition layer 17 covers the anode layer 16. Pixel openings are formed in a region of the pixel definition layer 17 corresponding to the anode layer 16. The pixel openings are filled with the luminescent layer 18. The luminescent layer 18 is connected to the anode layer 16.

In order to better explain the present disclosure, an embodiment is also provided a manufacturing method of an array substrate, and the specific steps include the following.

A substrate formation step S1:

A substrate is provided. The substrate includes a first flexible layer, a first buffer layer, a second flexible layer, and a second buffer layer which are sequentially formed, and the substrate has good flexibility.

A thin film transistor formation step S2:

A barrier layer is formed on the substrate.

A semiconductor layer is formed on the barrier layer. The semiconductor layer is active to form an active layer.

A first insulating layer is formed on the barrier layer, and the first insulating layer covers the active layer.

A first gate is formed on the first insulating layer.

A second insulating layer is formed on the first insulating layer, and the second insulating layer covers the first gate.

A second gate is formed on the second insulating layer.

A first dielectric layer is formed on the second insulating layer, and the first dielectric layer covers the second gate.

A third insulating layer is formed on the first dielectric layer.

A second dielectric layer is formed on the third insulating layer.

A first recess formation step and a second recess formation step S3:

The second dielectric layer and the third insulating layer are etched by a first mask. A first via hole is formed correspondingly to a display area, and a second via hole is formed correspondingly to a non-display area. The first via hole is a cylindrical via hole, and the second via hole is a long rectangular via hole.

The first dielectric layer, the second insulating layer, the first insulating layer, the active layer, and a portion of the barrier layer are etched by a second mask. A first inverted trapezoid recess is formed correspondingly to the first via hole. The first via hole is connected to the first inverted trapezoid recess to form a first recess. A second inverted trapezoid recess is formed correspondingly to the second via hole. The second via hole is connected to the second inverted trapezoid recess to form a second recess.

In this embodiment, the first via hole and the second via hole are formed by using the first mask, and the first inverted trapezoid recess and the second inverted trapezoid recess are formed by using the second mask. Thus, a number of masks is saved, process steps are also reduced, a manufacturing cost is reduced, and a product yield is improved.

A stepped surface is formed between a sidewall of the first via hole and a sidewall of the first inverted trapezoid recess, and the stepped surface is formed on the first dielectric layer.

A first source/drain electrode formation step S4:

A first source/drain electrode is formed on a dielectric layer at a top edge of the first recess. A middle section of the first source/drain electrode covers an inner sidewall and the bottom surface of the first recess. The first source/drain electrode covers the stepped surface, which is beneficial to reduce an internal tension of the first source/drain electrode and prevent the first electrode from breaking.

A passivation layer formation step S5:

A passivation layer is formed on the second dielectric layer. The passivation layer covers the first source/drain electrode and fills the first recess and the second recess.

A passivation layer etching step S6: the passivation layer inside the second recess is etched by a third mask.

A planarization layer formation step S7:

A planarization layer is formed on the passivation layer. The planarization layer extends from the display area to a bonding area. The planarization layer fills the second recess. In subsequent bending and bonding processes, the second recess can reduce adverse effects of bending stress.

Advantages of the present disclosure are as follow. In the array substrate and the manufacturing method thereof of the embodiments, the sidewall of the first recess extends through the second dielectric layer, the third insulating layer, the first dielectric layer, the second insulating layer, the first insulating layer, the active layer, and a portion of the barrier layer. The first recess has a relatively large diameter, which can effectively prevent inorganic materials from remaining in the first recess and reduce the contact resistance of the active layer and the source/drain electrode. The first recess makes the active layer form a cross-sectional surface on the sidewall of the first recess, and the source/drain electrode is arranged along the sidewall of the first recess. By connecting the sidewall of the first recess with the active layer, a contact area of the active layer and the source/drain electrode is increased. Moreover, the stepped surface is formed on the inner sidewall of the first recess, which has a buffering effect and prevents the source/drain electrode from breaking caused by an excessively long side wall of the first recess.

The description of the above embodiments is only used to help understand the technical solutions of the present disclosure and its core idea. A person of ordinary skill in the art should understand that the technical solutions described in the foregoing embodiments may be modified, or some of the technical features may be equivalently replaced. These modifications or replacements will not cause the essence of the corresponding technical solutions to deviate from the scope of the technical solutions of the embodiments of the present disclosure.

What is claimed is:

1. An array substrate, comprising:
    a substrate, wherein a barrier layer, an active layer, a first insulating layer, a second insulating layer, a first dielectric layer, a third insulating layer, and a second dielectric layer are sequentially disposed on a surface of the substrate;
    a first recess sequentially extending through the second dielectric layer, the third insulating layer, the first dielectric layer, the second insulating layer, the first insulating layer, the active layer, and a portion of the barrier layer, wherein a bottom surface of the first recess is formed inside the barrier layer; and
    a first source/drain electrode disposed on a surface of the second dielectric layer away from the third insulating layer and covering an inner sidewall and the bottom surface of the first recess, wherein the first source/drain electrode is connected to the active layer;
    wherein the first recess comprises:
    a first via hole extending through the second dielectric layer and the third insulating layer; and
    a first inverted trapezoid recess extending through the first dielectric layer, the second insulating layer, the first insulating layer, the active layer, and a portion of the barrier layer; and
    wherein the first inverted trapezoid recess is disposed correspondingly to the first via hole, and a width of an opening of the first inverted trapezoid recess is less than a diameter of the first via hole.

2. The array substrate according to claim 1, wherein an included angle between the inner sidewall of the first via hole and a surface of the first dielectric layer ranges from 40 degrees to 80 degrees.

3. The array substrate according to claim 1, further comprising:
    a first gate disposed on a surface of the first insulating layer away from the barrier layer, wherein the second insulating layer covers the first gate;
    a second gate disposed on a surface of the second insulating layer away from the first insulating layer, wherein the first dielectric layer covers the second gate; and
    a passivation layer disposed on the surface of the second dielectric layer away from the third insulating layer, covering the first source/drain electrode, and filling the first recess.

4. The array substrate according to claim 3, further comprising:
    a second recess sequentially extending through the passivation layer, the second dielectric layer, the third insulating layer, the first dielectric layer, the second insulating layer, the first insulating layer, the barrier layer, and a portion of the substrate; and
    a first planarization layer disposed on a surface of the passivation layer away from the second dielectric layer and filling the second recess.

5. The array substrate according to claim 4, wherein the substrate comprises:
    a first flexible layer;
    a first buffer layer disposed on a surface of the first flexible layer;
    a second flexible layer disposed on a surface of the first buffer layer away from the first flexible layer; and
    a second buffer layer disposed on a surface of the second flexible layer away from the first buffer layer; and
    wherein a bottom surface of the second recess is flush with a surface of the second flexible layer away from the first flexible layer.

6. An array substrate, comprising:
    a substrate, wherein a barrier layer, an active layer, a first insulating layer, a second insulating layer, a first dielectric layer, a third insulating layer, and a second dielectric layer are sequentially disposed on a surface of the substrate;
    a first recess sequentially extending through the second dielectric layer, the third insulating layer, the first dielectric layer, the second insulating layer, the first insulating layer, the active layer, and a portion of the barrier layer, wherein a bottom surface of the first recess is formed inside the barrier layer;
    a first source/drain electrode disposed on a surface of the second dielectric layer away from the third insulating layer and covering an inner sidewall and the bottom surface of the first recess, wherein the first source/drain electrode is connected to the active layer;
    a first gate disposed on a surface of the first insulating layer away from the barrier layer, wherein the second insulating layer covers the first gate;
    a second gate disposed on a surface of the second insulating layer away from the first insulating layer, wherein the first dielectric layer covers the second gate; and
    a passivation layer disposed on the surface of the second dielectric layer away from the third insulating layer, covering the first source/drain electrode, and filling the first recess;
    a second recess sequentially extending through the passivation layer, the second dielectric layer, the third insulating layer, the first dielectric layer, the second insulating layer, the first insulating layer, the barrier layer, and a portion of the substrate; and
    a first planarization layer disposed on a surface of the passivation layer away from the second dielectric layer and filling the second recess;

wherein the substrate comprises:
a first flexible layer;
a first buffer layer disposed on a surface of the first flexible layer;
a second flexible layer disposed on a surface of the first buffer layer away from the first flexible layer; and
a second buffer layer disposed on a surface of the second flexible layer away from the first buffer layer; and
wherein a bottom surface of the second recess is flush with a surface of the second flexible layer away from the first flexible layer.

7. A manufacturing method of an array substrate, comprising following steps:
providing a substrate;
sequentially forming a barrier layer, an active layer, a first insulating layer, a second insulating layer, a first dielectric layer, a third insulating layer, and a second dielectric layer on the substrate;
etching the second dielectric layer, the third insulating layer, the first dielectric layer, the second insulating layer, the first insulating layer, the active layer, and a portion of the barrier layer to form a first recess, wherein a bottom surface of the first recess is formed inside the barrier layer;
forming a first source/drain electrode on the second dielectric layer at a top edge of the first recess, and covering an inner sidewall and the bottom surface of the first recess with a middle section of the first source/drain electrode; and
forming a passivation layer on the second dielectric layer, wherein the passivation layer covers the first source/drain electrode;
wherein the step of forming the first recess comprises:
etching the second dielectric layer and the third insulating layer to form a first via hole; and
etching the first dielectric layer, the second insulating layer, the first insulating layer, the active layer, and a portion of the barrier layer at a position corresponding to a second via hole to form a first inverted trapezoid recess; and
wherein a stepped surface is formed between a sidewall of the first via hole and a sidewall of the first inverted trapezoid recess, and the stepped surface is formed on the first dielectric layer.

8. The manufacturing method of the array substrate according to claim 7, wherein after forming the first insulating layer, the method further comprises following step:
forming a first gate on the first insulating layer, wherein the first gate corresponds to the active layer; and
wherein after forming the second insulating layer, the method further comprises following step:
forming a second gate on the second insulating layer, wherein the second gate corresponds to the first gate.

9. The manufacturing method of the array substrate according to claim 7, wherein when the first via hole is formed, the second dielectric layer and the third insulating layer are etched to form the second via hole stimulatingly;
when the first inverted trapezoid recess is formed, the first dielectric layer, the second insulating layer, the first insulating layer, the barrier layer, and a portion of the substrate at a position corresponding to the second via hole are etched to form a second inverted trapezoid recess stimulatingly, and the second via hole and the second inverted trapezoid recess are connected to form a second recess; and
the first via hole and the second via hole are formed by a same mask, and the first inverted trapezoid recess and the second inverted trapezoid recess are formed by a same mask.

* * * * *